United States Patent
Katsui

[19]

[11] Patent Number: 6,043,980
[45] Date of Patent: Mar. 28, 2000

[54] HEAT SINK AND INFORMATION PROCESSOR USING IT

[75] Inventor: Tadashi Katsui, Kawasaki, Japan

[73] Assignee: Fujitsu Limited, Kawasaki, Japan

[21] Appl. No.: 09/001,464

[22] Filed: Dec. 31, 1997

[30] Foreign Application Priority Data

Feb. 24, 1997 [JP] Japan .................................. 9-039485
May 28, 1997 [JP] Japan .................................. 9-138840

[51] Int. Cl.[7] ............................................. H05K 7/20
[52] U.S. Cl. .......................... 361/695; 361/687; 361/690;
361/710; 361/722; 174/15.2; 174/16.3;
174/252; 165/80.2; 165/80.3; 165/185
[58] Field of Search ..................................... 361/687, 689,
361/690–710, 683, 714–722; 165/80.1,
80.2, 80.3, 121, 185, 146, 257, 104.33,
122; 174/16.3, 260, 52.3, 252; 257/690–721,
731

[56] References Cited

U.S. PATENT DOCUMENTS

| | | | |
|---|---|---|---|
| 5,272,599 | 12/1993 | Koenen | 361/710 |
| 5,377,745 | 1/1995 | Hsieh | 165/80.3 |
| 5,526,875 | 6/1996 | Lin | 165/80.3 |
| 5,583,316 | 12/1996 | Kitahara et al. | 174/16.3 |
| 5,594,623 | 1/1997 | Schwegler | 361/697 |

FOREIGN PATENT DOCUMENTS

| | | |
|---|---|---|
| 0 572 326 A2 | 12/1993 | European Pat. Off. . |
| 0 673 066 A1 | 9/1995 | European Pat. Off. . |
| 44 18 611 A1 | 2/1995 | Germany . |
| 296 10 532 U1 | 12/1996 | Germany . |
| 296 10 532U1 | 12/1996 | Germany . |
| 296 15 126 U1 | 12/1996 | Germany . |
| 296 15 126U1 | 12/1996 | Germany . |
| 62-49700 | 3/1987 | Japan . |
| 6-310629 | 4/1994 | Japan . |
| 6-268125 | 9/1994 | Japan . |
| 8-17979 | 1/1996 | Japan . |
| 8-8564 | 1/1996 | Japan . |
| 8-502804 | 3/1996 | Japan . |
| 8-83875 | 3/1996 | Japan . |
| 8-316380 | 11/1996 | Japan . |
| 8-330480 | 12/1996 | Japan . |
| 2 309 775 | 8/1997 | United Kingdom . |

OTHER PUBLICATIONS

Abstract of Japanese Publication No. 8–017979.
Abstract of Japanese Publication No. 8–321571.
Abstract of Japanese Publication No. 5–304379.

*Primary Examiner*—Leo P. Picard
*Assistant Examiner*—Michael Datskovsky
*Attorney, Agent, or Firm*—Armstrong, Westerman, Hattori, McLeland, & Naughton

[57] ABSTRACT

The present invention relates to a heat sink. It is an object of the present invention to provide a heat sink at a low manufacturing cost, the life of the motor of which is long so that the reliability of the heat sink can be enhanced and, further, a sufficiently high cooling performance can be obtained and the designing of the heat sink can be easily performed. The heat sink includes: a bottom surface coming into contact with a heating element; a side on which a plurality of ventilation holes are formed; and an upper surface into which a cooling fan composed of blades and a motor is embedded and fixed.

5 Claims, 16 Drawing Sheets

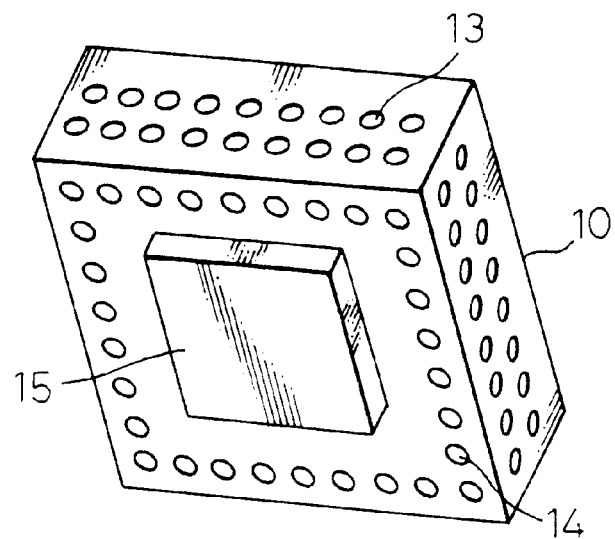
Fig.3A
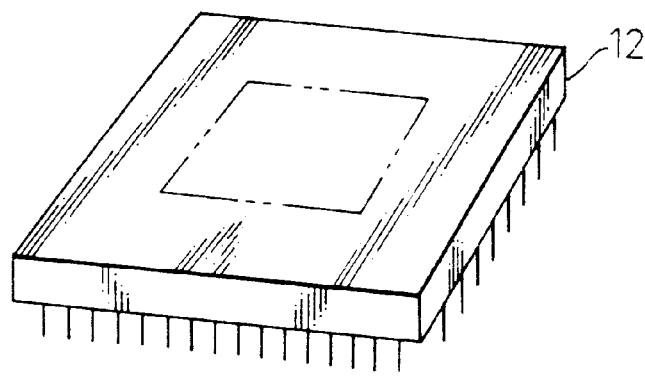
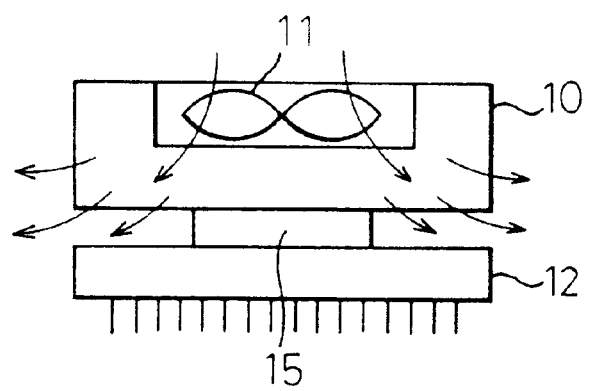
Fig.3B

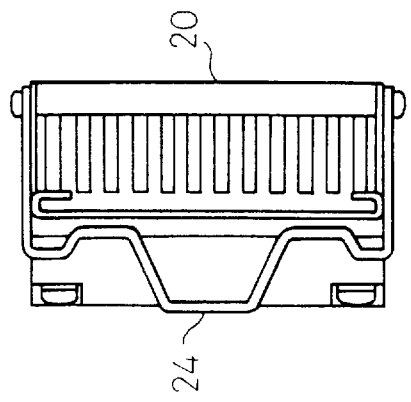
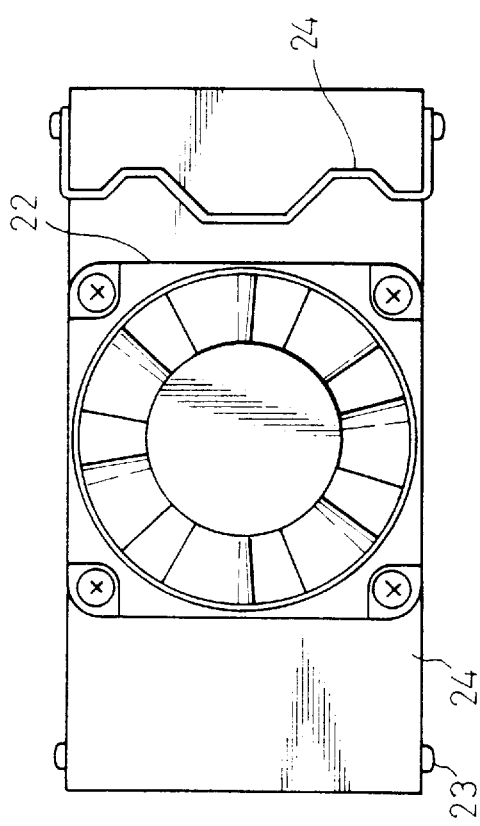
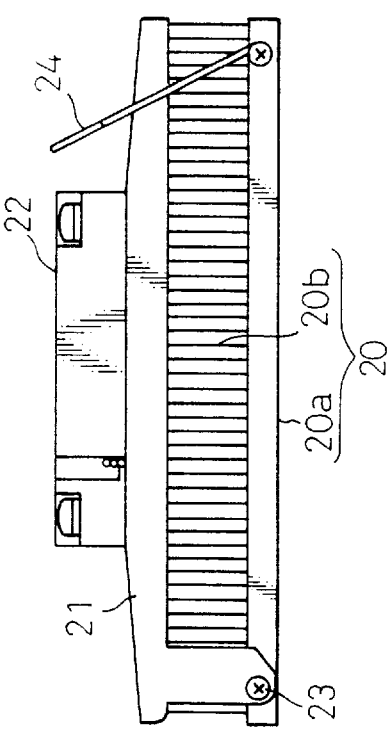

HEAT SINK AND INFORMATION PROCESSOR USING IT

BACKGROUND OF THE INVENTION

1. Field of the Invention

The present invention relates to a heat sink. More particularly, the present invention relates to a heat sink used for cooling an integrated circuit package, which generates heat, such as a microprocessor unit (MPU) incorporated into electronic equipment.

2. Description of the Related Art

Recently, concerning the integrated circuits used for a personal computer, especially concerning the MPU, the degree of integration is enhanced so as to enhance the function of the integrated circuit and increase the processing speed. Therefore, the quantity of heat generated in the integrated circuit has been increased. Accordingly, the inside of the casing of a personal computer is forcibly cooled by a cooling fan, and the MPU is located at a position where the cool air of the cooling fan flows, and a heat sink provided with a large number of fins is fixed to the MPU so that the MPU can be forcibly air-cooled. However, an MPU of a higher performance is now required for a personal computer. An MPU of a higher performance generates a quantity of heat larger than that generated by other electronic parts. For this reason, there is used a heat sink into which a cooling fan is incorporated so that an MPU, which generates a large quantity of heat, can be locally cooled by means of forcible air cooling. Such a heat sink into which a cooling fan is incorporated as a local cooling means is used to replace a conventional heat sink into which a cooling fan is not incorporated. Accordingly, there is proposed a heat sink of small size in which the cooling fan or a portion of the cooling fan is incorporated inside the cooling fins.

FIGS. 15A–C are views showing a heat sink described in Japanese Unexamined Patent Publication No. 62-49700 which is used as a local cooling means. FIG. 15A is a plan view which is taken from the upper surface side, FIG. 15B is a cross-sectional view taken at the one-dotted chain line ABCD shown in FIG. 15A, and FIG. 15C is a plan view taken in the direction of arrow Z in FIG. 15B. As shown in FIGS. 15A and 15B, this heat sink is composed in such a manner that a motor 2a, which is a drive section for blades 2b, is attached to the main body 1 of the heat sink, and fins 1a are perpendicularly arranged so that they surround the blades 2b. As shown in FIGS. 15B and 15C, the main body 1 of the heat sink is fixed to a heating element 3 such as a power transistor. Heat generated in the heating element is conducted to a bottom portion of the main body of the heat sink and further conducted to the fins 1a. When the motor 2a is driven, the blades 2b are rotated, so that cooling air is sucked from an upper portion of the cooling fan 2. The cooling air to which a centrifugal force is given by the rotation of the blades 2b cools the upper portions of the fins 1a, and the cooling air blown out downward by the blades 2b cools lower portions of the fins 1a. In this way, the cooling air which has been sucked from the upper portion passes through the fins 1a is discharged into the periphery of the heat sink. Therefore, the main body 1 of the heat sink can be cooled and further the heating element 3 can be cooled.

FIG. 16 is a view showing the heat sink described in Japanese Unexamined Patent Publication (PCT route) No. 8-502804. In the overall periphery of the main body 1 of the heat sink, there are provided a plurality of perpendicular fins 1a, and the cooling fan 2 is supported by the main body 1 of the heat sink. When the motor is arranged inside the blades 2b, the height of the cooling fan 2 in the axial direction is reduced, and when a portion of the cooling fan 2 intrudes into the main body of the heat sink, the thickness of the fan body 5 is reduced. When the cooling fan 2 is driven, the blades 2b are rotated, so that a cooling air can be sucked from the upper portion. The thus sucked cooling air cools the bottom portion of the main body 1 of the heat sink and passes through among the fins 1a. Therefore, the cooling air absorbs the heat which has been conducted from the main body 1 of the heat sink to the fins 1a, and the absorbed heat is dissipated to the periphery of the heat sink. When this heat sink is fixed to a heating element such as an MPU, the heating element can be locally cooled.

FIG. 17A and 17B are views showing the heat 15 sink described in Japanese Unexamined Patent Publication No. 6-268125. FIG. 17A is a plan view which is taken from the upper surface. FIG. 17B is a cross-sectional view taken on line B—B in FIG. 17A. The motor 2a of the cooling fan 2 is fixed to the bottom portion of the main body 1 of the heat sink, and cooling fins 1a are perpendicularly arranged in such a manner that they surround the cooling fan 2. The bottom portion of the main body 1 of the thus composed heat sink is fixed to a heating element 3 such as an MPU. When the motor 2a is driven, the blades 2b are rotated, so that a cooling air can be sucked from the upper portion. The sucked cooling air passes through among the fins 1a and discharges into the periphery of the heat sink. When the fins 1a are cooled, the heating element 3 can be cooled via the main body 1 of the heat sink.

In the heat sinks shown in FIGS. 15A–C and 17A and 17B, the motor 2a which drives the cooling fan 2 is directly fixed to the bottom portion of the main body 1 of the heat sink. In the driving section of the cooling fan 2, ball bearings or sleeve bearings are used, and lubricant such as grease or oil is charged in the bearing. Due to the above structure, heat is directly transmitted to the bearing from the bottom portion of the main body 1 of the heat sink located close to the heating element 3. Accordingly, the temperature of the bearing is raised. When the temperature of the bearing is raised, the deterioration of the grease or oil is facilitated, and the life of the motor 2a is shortened.

In the heat sink shown in FIG. 16, the cooling fan 2 is mounted on the upper portion. Accordingly, areas of the fins 1a arranged on the side are small. Therefore, in order to realize a sufficiently high cooling performance, it is necessary to provide small fins with very small intervals between the fins. In order to realize the small fins 1a, the manufacturing cost is increased in the cutting process. Further, since the intervals between the fins 1a are very small, blocking tends to occur when dust gathers between the fins 1a. Accordingly, a quantity of cooling air is lowered, and the cooling performance is deteriorated.

In the structure of the heat sinks shown in FIGS. 15A–C and 17A and 17B in which the fins 1a are perpendicularly arranged on the overall bottom surface of the main body 1 of the heat sink, analysis of the flow of the cooling air becomes complicated and also analysis of the noise becomes complicated. Therefore, it is difficult to design the heat sink. Accordingly, it is impossible to optimize the cooling performance and reduce the noise.

SUMMARY OF THE INVENTION

It is an object of the present invention to provide a heat sink of low manufacturing cost and long life, the cooling performance of which is sufficiently high and in which the designing of the heat sink can be easily performed.

The invention first aspect of the invention is to provide a heat sink comprising a box composed of a bottom surface coming into contact with a heating element, a side on which ventilation holes are formed and an upper surface on which a cooling fan having at least blades and a motor is embedded and fixed. Due to the above structure, when the design of the hole is changed, the performance can be easily optimized, and when the upper surface is provided on the box and the cooling fan is fixed onto the upper surface, the area of the side of the box can be sufficiently ensured, and further the deterioration of lubricant in the motor bearing can be prevented.

The second aspect of the invention is to provide a heat sink in which the bottom surface is larger than a heat transmitting section coming into contact with the heating element, and ventilation holes are formed at positions on the bottom surface different from the position of the heat transmitting section. Due to the above structure, a change in the design of the hole can be performed in a wide range. Therefore, it becomes easy to optimize the performance. Further, the cooling performance can be enhanced and the noise generated by the cooling fan can be decreased.

The third aspect of the invention is to provide a heat sink in which the ventilation holes formed on the bottom surface are open under the condition that the heat transmitting section comes into contact with the heating element. Due to the above structure, the quantity of cooling air passing through in the holes formed on the bottom surface of the box is increased, so that the performance of cooling the bottom surface of the box can be enhanced. Compared with a case in which holes are formed only on the side, the cooling air can flow smoothly. Therefore, the occurrence of noise can be decreased.

The fourth aspect of the invention is to provide a heat sink comprising: a box composed of a bottom surface coming into contact with a heating element, a side on which ventilation holes are formed and an upper surface, the bottom surface having a heat transmitting section coming into contact with the heating element and also having ventilation holes; and a cooling fan composed of blades and a motor, wherein the cooling fan is embedded in the upper surface. When the upper surface is provided as described above, it is possible to ensure a sufficiently large area of the side which connects with the upper surface. Accordingly, the cooling performance can be enhanced. Further, it is possible to introduce a cooling air into the holes formed on the side and the bottom surface of the box. Therefore, the occurrence of noise can be decreased and the cooling performance can be enhanced.

The fifth aspect of the invention is to provide a heat sink in which a radiating member is arranged between the cooling fan and the bottom surface of the box, and a portion of the radiating member is fixed onto the bottom surface. Due to the above structure, surface areas of the radiating fins are added to the surface area of the box. Therefore, the cooling performance can be enhanced.

The sixth aspect of the invention is to provide a heat sink in which the dimensions of the box are larger than those of the heating element and are made to coincide with the outside dimensions of a socket holding the heating element, and the center of the cooling fan is located eccentric with respect to the center of the heating element. Due to the above structure, it is possible to fix the box to the socket. Even if the rotational center of the cooling fan is different from the heating center of the heating element, it is unnecessary to change the design of the holes on the side and also it is unnecessary to correct the design. Since the center of each component is different, it is possible to cool a portion of high temperature at the heating center by the strongest air flow sent out from the blades of the cooling fan. Accordingly, the cooling performance can be enhanced.

The seventh aspect of the invention is to provide a heat sink comprising: a heat sink component having a bottom surface coming into contact with a heating element; a cooling fan having at least blades and a motor and a cover for fixing the fan to the heat sink component, wherein the cover is used for setting a distance so that a distance from the bottom surface of the cover at the end of the heat sink component to the upper surface of the heat sink component can be smaller than a distance from the bottom surface of the cover immediately below the fan to the upper surface of the heat sink component. Due to the above structure, it is possible to minimize the deterioration of the cooling performance without increasing the intensity of noise.

The eighth aspect of the invention is to provide a heat sink comprising: a heat sink component having a bottom surface coming into contact with a heating element; a cooling fan having at least blades and a motor; and a cover for fixing the fan to the heat sink component, wherein the cover can be opened and closed round a hinge arranged at one end of the cover and locked at the other end. Due to the above structure, it is possible to conduct working on the heating element without removing the cover and the fan. That is, when the heat sink component to which the fan is attached is fixed to the heating element, it is possible to expose a hole for fixing the heat sink component by disengaging the lock of the cover and opening and closing it. Accordingly, it can be screwed and fixed there.

The ninth aspect of the invention is to provide a heat sink comprising: a rectangular heat sink component having a bottom surface coming into contact with a heating element; a cooling fan having at least blades and a motor and a cover for fixing the fan to the heat sink component, wherein a heat conveyance member for diffusing heat is attached to the base of the heat sink component. Due to the above structure, the temperature at the end portion is not lowered, that is, the temperature of the overall heat sink can be made uniform. Accordingly, the cooling performance can be enhanced. The reason why the temperature of the overall heat sink can be made uniform is described as follows. In the case of a heat sink, the shape of which is rectangular, a quantity of heat transmitted in the longitudinal direction is decreased. Accordingly, the radiating efficiency of the heat sink is lowered at the end portion. However, according to the invention described in the claim, a heat conveyance member is arranged from the center of high temperature to the end in the longitudinal direction. Therefore, heat can be conveyed to the end portion of the heat sink.

The tenth aspect of the invention is to provide an information processor comprising: a heat sink component having a bottom surface coming into contact with a heating element; a cooling fan having at least blades and a motor; and a cover for fixing the fan to the heat sink component, wherein a heat conveyance member is attached to the base of the heat sink component so as to convey heat to another cooling section. Due to the above structure, even if a quantity of heat generated by the heating element is increased, it is possible to incorporate the heat sink having the fan into the mounting space used presently. Up to this time, when the heat sink having the fan is incorporated into a limited mounting space, it is impossible to increase the volume of the heat sink and the capacity of the cooling fan in the case of an increase in the quantity of heat generated by the heating element when the processing speed is raised. However, according to the invention described in the claim, the heat conveyance member is arranged in the heat sink, and the increased heat is conveyed to another cooling unit by the heat conveyance member.

The eleventh aspect of the invention is to provide an information processor comprising: a heat sink component having a bottom surface coming into contact with a heating element; a heating element; and a printed circuit board, wherein the heat sink component and the cooling fan are fixed onto the printed circuit board by a bracket for fixing the heat sink having a cooling fan utilizing a hole for fixing the cooling fan. Due to the above structure, the hole for fixing the cooling fan is used. Therefore, while it is unnecessary to conduct an additional machining, the heat sink and the cooling fan can be attached to the printed circuit board of the apparatus. Accordingly, the occurrence of vibration and shock can be prevented at a low cost.

BRIEF DESCRIPTION OF THE DRAWINGS

These and other objects of the present invention will become apparent from the following detailed description of the preferred embodiment of the invention, taken in connection with the accompanying drawings.

In the drawings:

FIGS. 1A and 1B are views showing the first embodiment of the present invention together with an MPU, wherein FIG. 1A is a perspective view and FIG. 1B is a cross-sectional view;

FIGS. 3A and 3B are views showing the third embodiment of the present invention together with an MPU, wherein FIG. 3A a perspective view and FIG. 3B is a schematic cross-sectional view;

FIGS. 4A, 4B, and 4C are views showing the fourth embodiment of the present invention together with an MPU, wherein FIG. 4A is a schematic cross-sectional view, FIG. 4B is a schematic cross-sectional view of the conventional heat sink shown for the purpose of comparison, and FIG. 4C is a schematic illustration for explaining the mode of operation of the embodiment;

FIGS. 5A and 5B are views showing the fifth embodiment of the present invention, wherein FIG. 5A is a partially cross-sectional side view and FIG. 5B is a perspective view showing a radiating member;

FIGS. 7A and 7B are views showing the sixth embodiment of the present invention, wherein FIG. 7A is a view showing the embodiment together with an MPU connected with a socket, and FIG. 7B is a view for explaining the effect provided by the eccentricity of a cooling fan;

FIGS. 8A, 8B, and 8C are views showing the seventh embodiment of the present invention, wherein FIG. 8A is a plan view, FIG. 8B is a front view, and FIG. 8C is a side view;

FIGS. 10A, 10B, and 10C are views showing the eighth embodiment of the present invention, wherein FIG. 10A is a plan view, FIG. 10B is a front view, and FIG. 10C is a side view;

FIGS. 11A, 11B, and 11C are views showing the ninth embodiment of the present invention, wherein FIG. 11A is a perspective view, FIG. 11B is a cross-sectional view, and FIG. 11C is a rear view;

FIGS. 12A and 12B are views showing the tenth embodiment of the present invention, wherein FIG. 12(a) is a cross-sectional view, and FIG. 12(b) is a view showing a variation of the embodiment;

FIGS. 13A and 13B are views showing the eleventh embodiment of the present invention, wherein FIG. 13A is a cross-sectional view, and FIG. 13B is a view taken in the direction of arrow Z in FIG. 13A;

FIGS. 14A, 14B, and 14C are views showing a bracket for fixing the heat sink of the eleventh embodiment of the present invention, wherein FIG. 14A is an upper surface view, FIG. 14B is a side view, and FIG. 14C is a view taken in the di on of arrow Z in FIG. 14B;

FIGS. 15A, 15B, and 15C are views showing an example of the conventional heat sink, wherein FIG. 15A is a plan view, FIG. 15B is a cross-sectional view taken on line ABCD in FIG. 15A, and FIG. 15C is a view taken in the direction of arrow Z in FIG. 15B;

FIGS. 17A and 17B are views showing still another example of the conventional heat sink, wherein FIG. 17A is a plan view, and FIG. 17B is a cross-sectional view taken on line B—B in FIG. 17A.

DESCRIPTION OF THE PREFERRED EMBODIMENTS

Figure 1A:
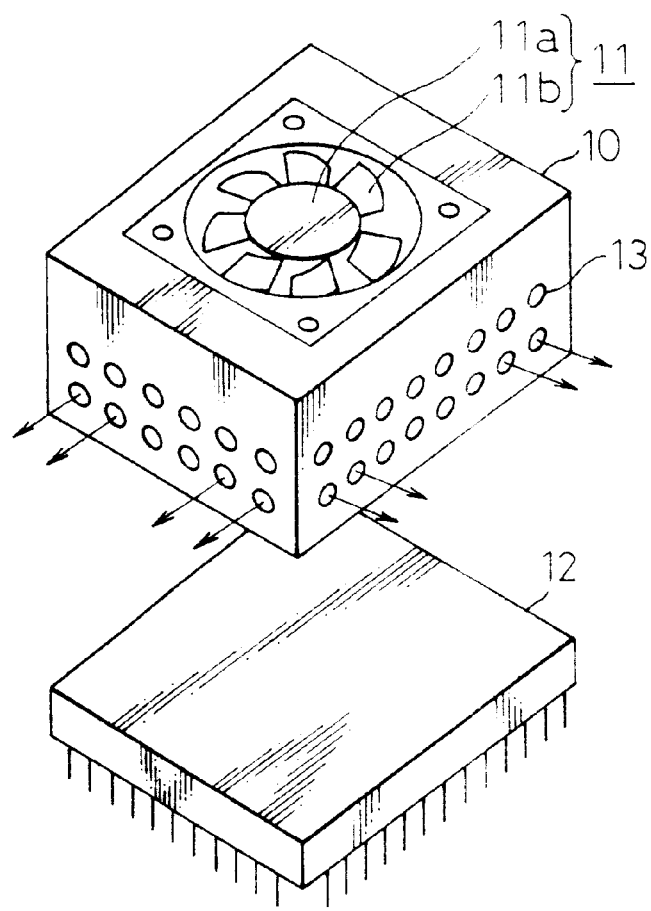
Figure 1B:
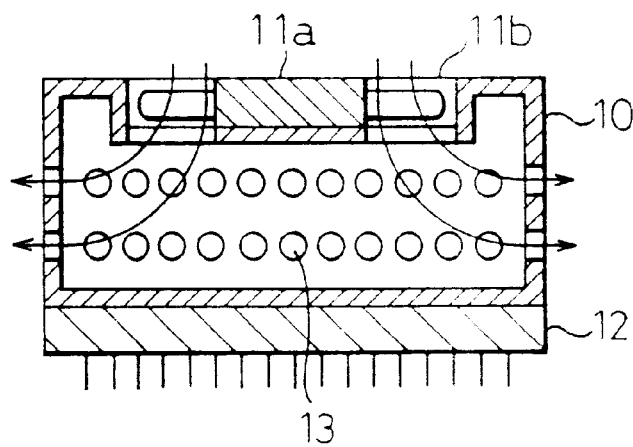

FIGS. 1A and 1B are views showing the first embodiment of the present invention together with an MPU which is a heating element. FIG. 1A is a perspective view showing a heat sink together with an MPU, and FIG. 1B is a cross-sectional view taken on a line passing through the center of the heat sink shown in FIG. 1A in which the heat sink is fixed to an MPU. The heat sink of the first embodiment of the invention comprises a box 10 and a cooling fan 11 arranged in the ceiling section of the box 10. The box 10 is made of good heat conducting material, and the bottom of the box 10 is formed into a heat transmitting section which comes into contact with a heating element 12. On the side walls of the box 10, there are provided a plurality of ventilation holes 13. In the ceiling section of the box, there is provided a cooling fan composed of blades 11b and a motor 11a to rotate the blades 11b. This cooling fan is fixed onto the ceiling surface of the box 10 by means of screws or adhesion.

In this connection, examples of a good heat conducting material composing the box 10 are: metal such as aluminum, and plastics such as resin, the brand name of which is Amoco Xydar manufactured by Wake Field Engineering Co., into which carbon fibers are mixed. In the case of metal, a method of sheet metal forming or of aluminum die casting is used. In the case of plastics, the method of injection molding is used. Shapes of the ventilation holes formed on the side wall of the box 10 may be circular, triangular or polygonal. While consideration is given to air speed, heat transmission and noise, the best position and the number of holes are determined. According to an experiment carried out by the inventors, the best result was obtained when the total area of the ventilation holes 13 was approximately 15% of the total area of the sides of the box 10.

In the first embodiment of the invention composed as described above, when the blades 11b of the cooling fan 11 are rotated by the motor 11a, air is sucked from the upper surface of the cooling fan 11. The sucked air is discharged from the ventilation holes 13 on the side walls as shown by the arrows in FIG. 1B. Heat generated by the heating element 12 is conducted from the bottom of the box 10 to the side walls. Then the conducted heat is cooled by a flow of air sent from the fan 11. Air which has absorbed the heat is discharged outside from the ventilation holes 13. In this way, an MPU 12 can be cooled by air. In this connection, the direction of air flow may be reversed.

According to this first embodiment, the main body of the heat sink is formed into a box-shape. Therefore, it becomes possible to extend the wall surface of the heat sink to the ceiling surface and the side surface portion in which the cooling fan is arranged, that is, it becomes possible to ensure sufficiently large fin areas. For this reason, it is unnecessary to provide cooling fins of complicated shapes, so that the fins can be manufactured at a low cost. Since the motor of the cooling fan is arranged at the ceiling portion distant from an MPU, the bearing of the fan is not exposed to high temperatures. Accordingly, the deterioration of lubricant charged into the bearing can be prevented, and the reliability can be enhanced.

Figure 2:
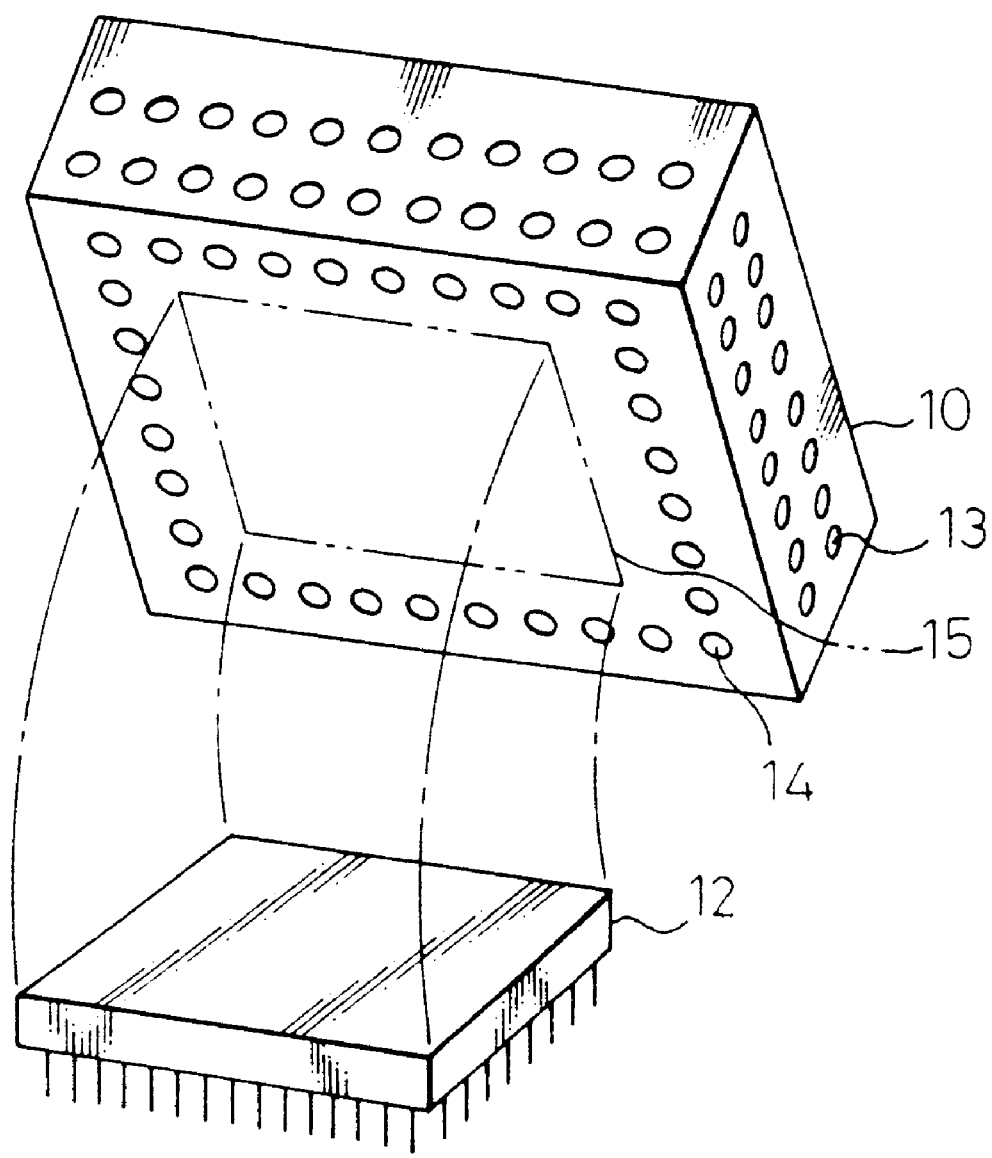
FIG. 2 a view showing the second embodiment of the present invention together with an MPU.

FIG. 2 is a view showing the second embodiment of the present invention together with an MPU. The structure of the second embodiment is substantially the same as that of the first embodiment. The different points are described below. The bottom portion of the box 10 is formed larger than the outer shape of an MPU 12 to be cooled; the heat transmitting section 15 is made smaller than the bottom surface of the box 10; and a plurality of ventilation holes 14 are also formed in a portion of the bottom surface protruding from the MPU 12. According to an experiment done by the inventors, it was possible to provide a good result when the total area of the ventilation holes 14 formed on the bottom surface of the box 10 was approximately 20% of the area of the bottom surface of the box. As a result, it is preferable that the total area of the holes formed on the sides and the bottom surface of the box 10 is approximately 15 to 20% of the total area of the sides and the bottom surface of the box 10.

Since the second embodiment of the invention is composed as described above, the radiating area of the box of the second embodiment is larger than that of the first embodiment. Accordingly, the radiating performance of the second embodiment can be enhanced. Concerning other points, the second embodiment can provide the same effect as that of the first embodiment.

FIGS. 3A and 3B are views showing the third embodiment of the present invention together with an MPU. FIG. 3A is a perspective view, and FIG. 3B is a schematic cross-sectional view. The structure of the third embodiment is substantially the same as that of the second embodiment. One different point is that the heat transmitting section 15 of the box 10 protrudes from the bottom surface of the box. This protruding portion can be formed as follows. A plate made of a good heat conducting material is machined to a predetermined size and fixed onto the bottom surface of the box 10 by means of adhesion, soldering or calking. Alternatively, in the manufacturing process in which the box 10 is formed by means of sheet metal forming, aluminum die casting or injection molding, this protruding portion is formed from the same material as that of the box.

In the third embodiment composed as described above, the heat transmitting section 15 is contacted with an MPU 12 as shown in FIG. 3B. When the heat sink is operated, air is sucked into the box from the upper surface of the cooling fan 11. The sucked air is discharged from the ventilation holes 13 formed on the sides of the box 10 and the ventilation holes 14 formed on the bottom surface. The air discharged from the ventilation holes 14 formed on the bottom surface passes through between the bottom surface of the box 10 and the heating element 12 and discharges outside. Heat generated by the MPU is transmitted to the box 10 via the heat transmitting section 15 and radiates into air.

According to the third embodiment, while the size of the heat sink is maintained to be the same as that of the heat sink of the first embodiment, the cooling area can be increased, and the cooling performance can be enhanced. In this connection, other points are the same as those of the first embodiment.

Figure 4A:
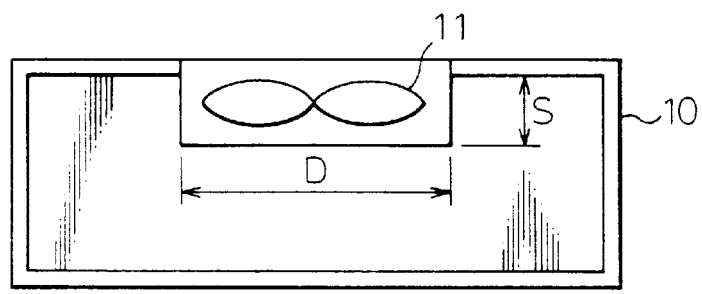
Figure 4B:
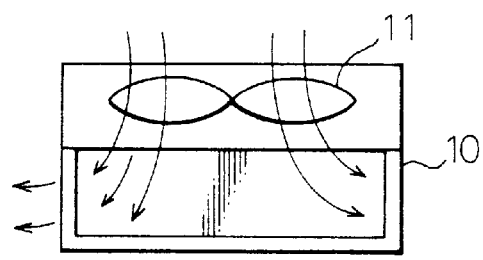
Figure 4C:
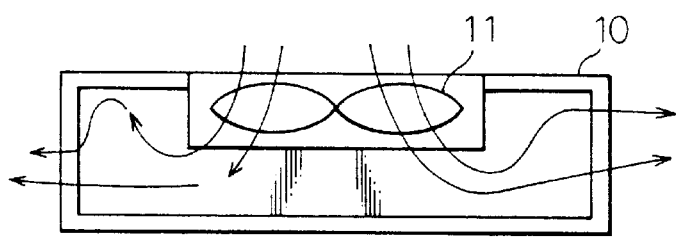

FIGS. 4A, 4B and 4C are views showing the fourth embodiment of the present invention. FIG. 4A is a schematic cross-sectional view, FIG. 4B is a schematic cross-sectional view of the conventional heat sink shown for the purpose of comparison, and FIG. 4C is a schematic illustration showing the operation of this embodiment. The structure of the fourth embodiment is substantially the same as that of the first embodiment. One different point is that ventilation holes are formed on the sides of the air gap portion S arranged in parallel with the cooling fan 11.

In the fourth embodiment composed as described above, as shown in FIG. 4C, air flows out from the overall sides of the box. Therefore, the pressure in the box 10 can be decreased, and the air speed can be increased. Accordingly, air can be made to flow efficiently from the cooling fan 11 to the periphery. Therefore, the cooling efficiency of this embodiment can be more enhanced than the conventional heat sink shown in FIG. 4B. In this connection, other points are the same as those of the first embodiment.

Figure 5A:
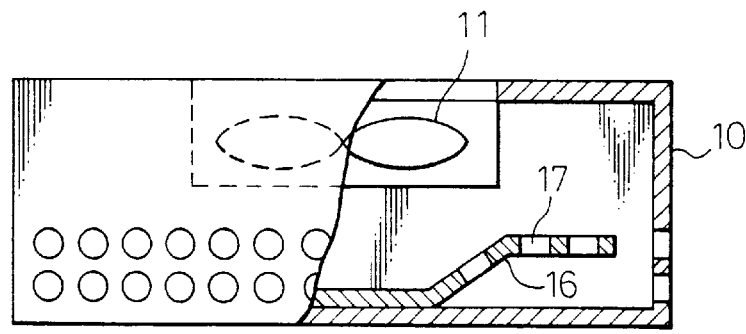
Figure 5B:
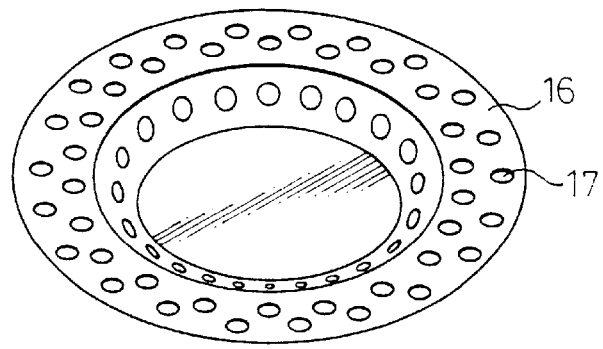

FIGS. 5A and 5B are views showing the fifth embodiment of the present invention. FIG. 5A is a cross-sectional view, and FIG. 5B is a perspective view showing a radiating member. The structure of the fifth embodiment is substantially the same as that of the first embodiment. One different point is that a radiating member 16 having ventilation holes 17 is arranged on the inner surface of the bottom of the box 10. This radiating member 16 is made of a good heat conducting material such as metal or plastic, and it is formed into a fin-shape in which a disk and a circular cone are combined as shown in FIG. 5B. In the fin portion, there are provided a plurality of holes 17.

Figure 6A:
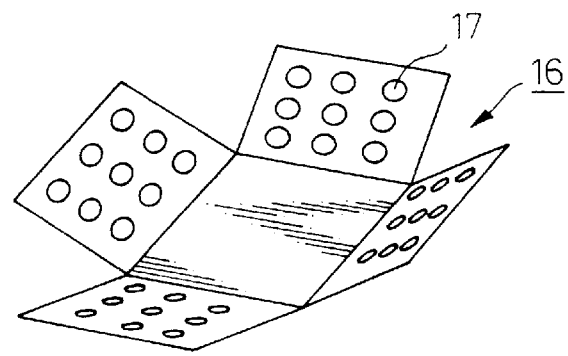
FIGS. 6A and 6B are perspective views showing another example of the radiating member of the fifth embodiment of the present invention.
Figure 6B:
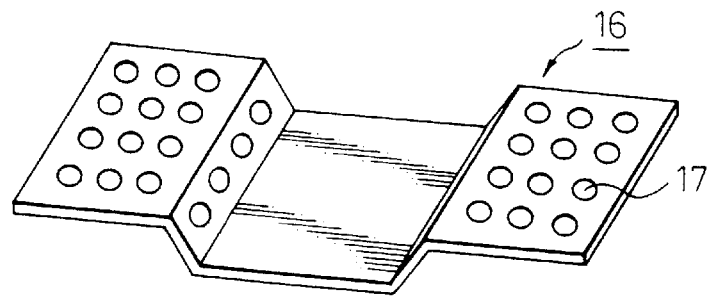

FIGS. 6A and 6B are perspective views showing another example of the radiating member of the fifth embodiment. Both FIGS. 6A and 6B show other examples of the radiating member. The radiating member may be formed into a shape shown in FIG. 6A in which the inclined fins are extended in all directions. Alternatively, the radiating member may be formed into a shape shown in FIG. 6B in which the horizontal fins are extended in the transverse direction. Alternatively, other shapes may be adopted as long as the air speed, heat transmission and noise are well balanced.

In the fifth embodiment composed as described above, the radiating area is increased as the radiating member 16 is provided. Accordingly, the cooling performance of the fifth embodiment is higher than that of the first embodiment. In this connection, the effect of the fifth embodiment is the same as that of the first embodiment.

Figure 7A:
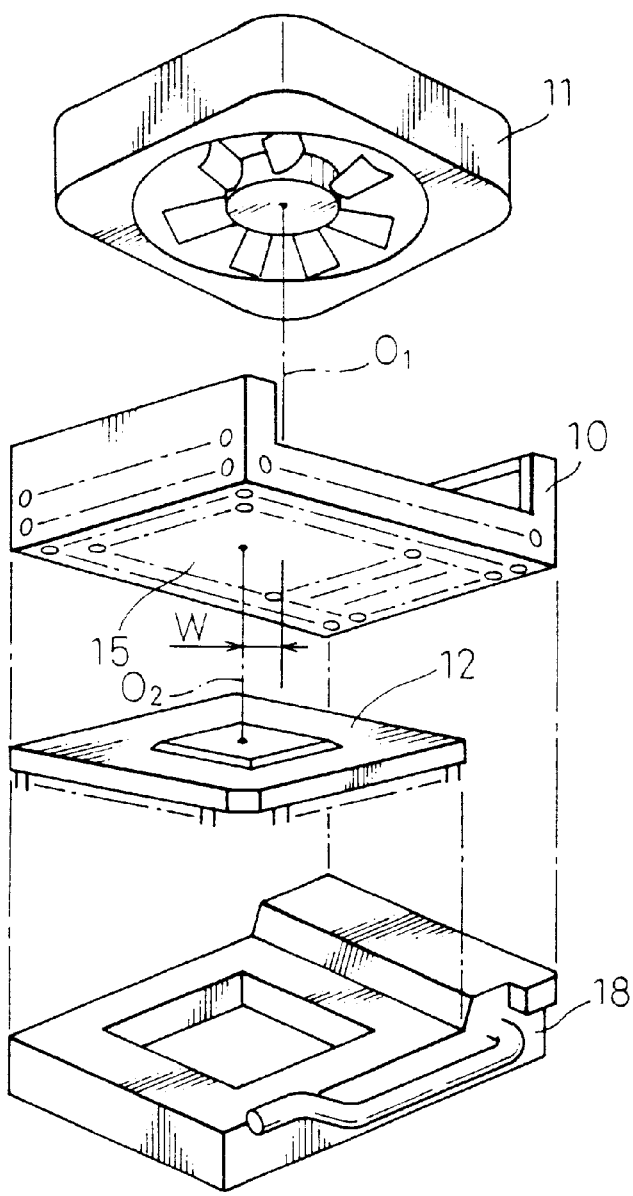
Figure 7B:
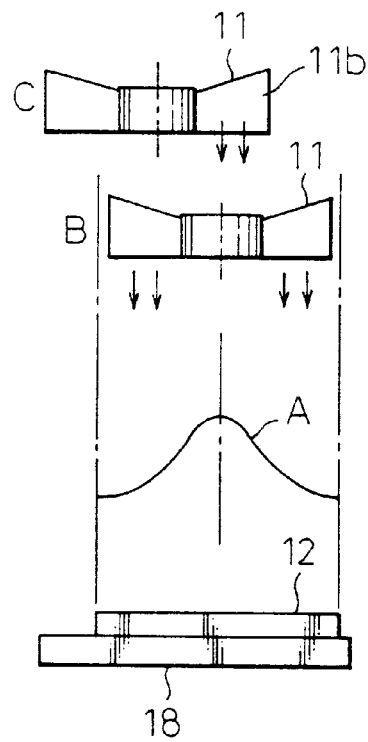

FIGS. 7A and 7B are views showing the sixth embodiment of the present invention. FIG. 7A is a perspective view showing the heat sink together with an MPU mounted on the socket. FIG. 7B is a view for explaining the effect of the eccentric fan. As shown in FIG. 7A, in the desk-top type personal computer, there is provided a socket 18 to which the MPU 12 can be easily attached and from which the MPU 12 can be easily detached, and when the heat sink is used, the terminals of the MPU 12 can be connected to the socket 18 under pressure so as to attain a positive connection. In order to realize the above attaching and detaching function, the socket 18 requires a redundant space in one direction of the MPU 12. Therefore, the size of the socket 18 is larger than that of the MPU 12. When this socket 18 is used, the center $O_1$ of the cooling fan 11 can be arranged at a position eccentric to the center $O_2$ of the MPU 12 by a distance W when the box 10 is formed into a size which is substantially the same as the size of the socket 18. Since the center of the box 10 is eccentric to the center of the MPU 12, the center of the heat transmitting section 15 is also eccentric to the center.

The mode of operation of the sixth embodiment composed as described above will be explained below referring to FIG. 7B. Curve A is a temperature distribution curve of the MPU 12. At the middle of the temperature distribution curve, the temperature is the highest. In the case of no eccentricity, the cooling fan 11 is located at point B, however, in the case of eccentricity of this embodiment, the cooling fan 11 is located at point C. Therefore, in this embodiment, the strongest wind sent out from the blades 11b of the cooling fan 11 is made to blow against the bottom portion of the box 10 which comes into contact with the high temperature portion of the heating element 12. Consequently, the cooling performance can be enhanced. In this connection, other effects provided by the sixth embodiment are the same as those of the first embodiment.

Figure 8C:
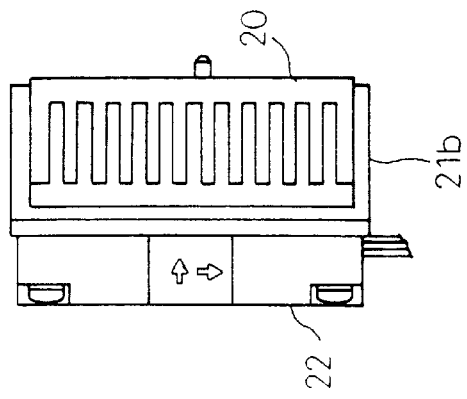
Figure 8A:
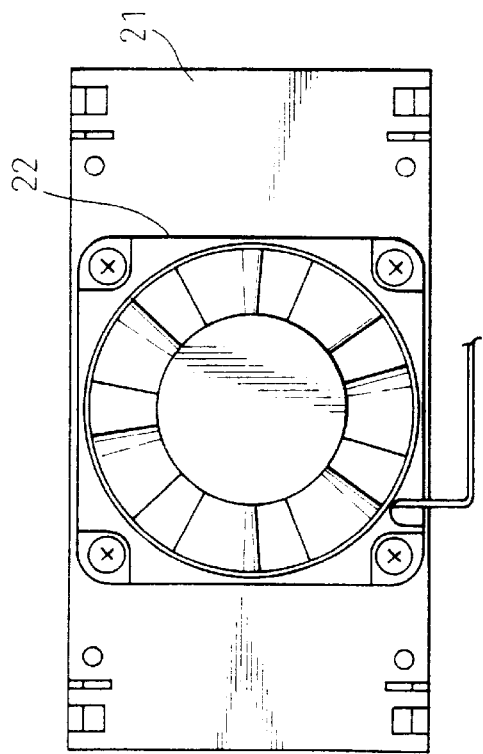
Figure 8B:
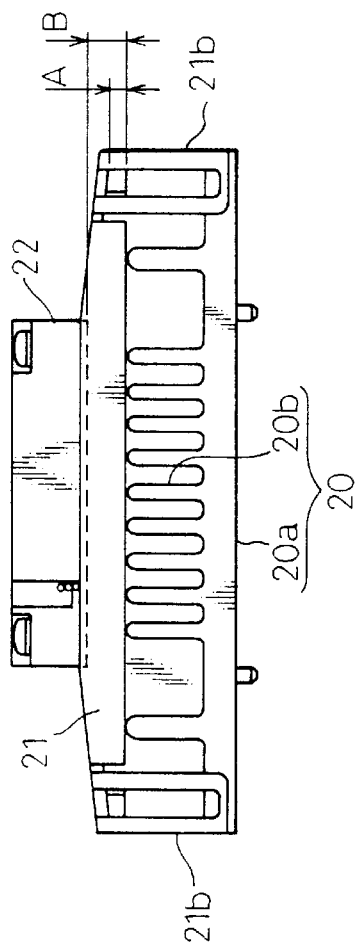
Figure 9:
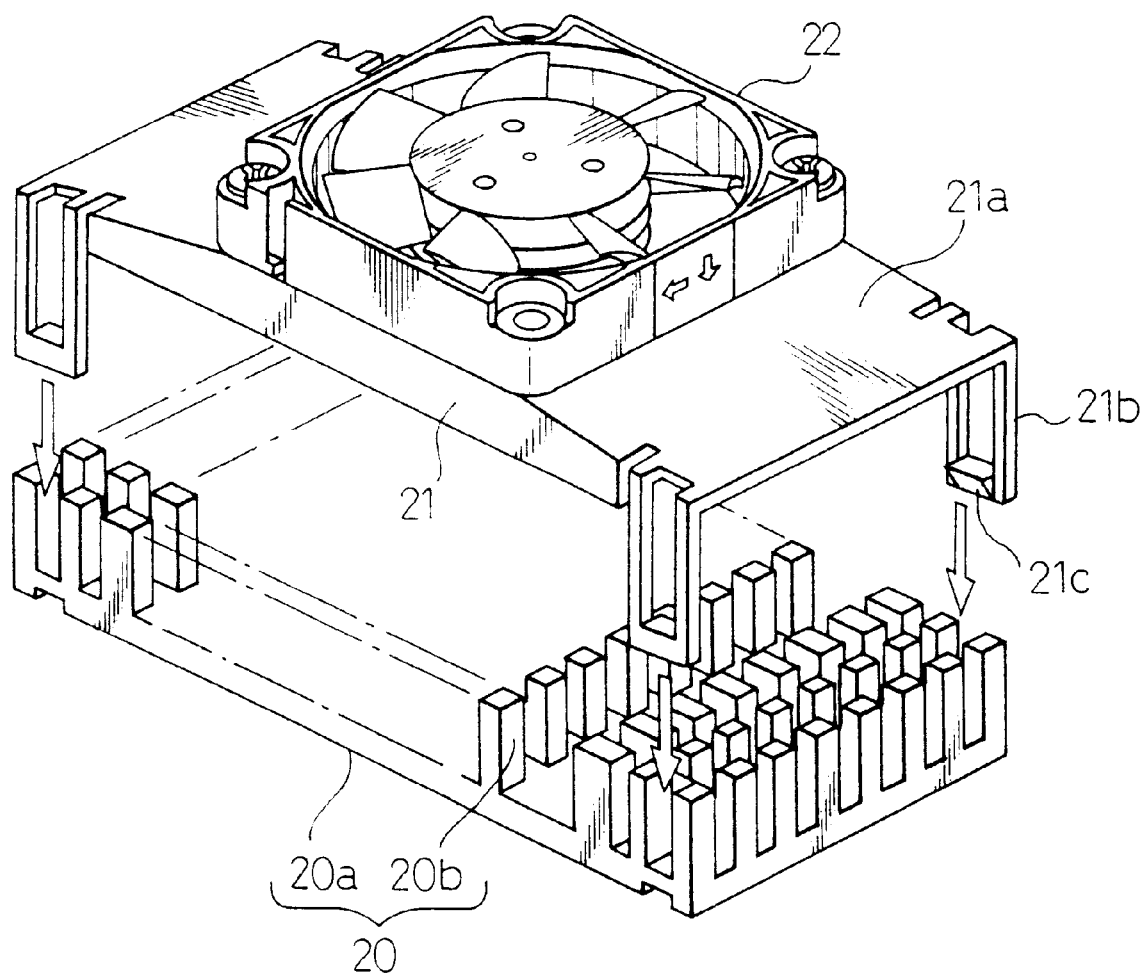
FIG. 9 is an exploded perspective view showing the seventh embodiment of the present invention.

FIGS. 8A, 8B, and 8C and 9 are views showing the seventh embodiment of the present invention. FIG. 8A is a plan view, FIG. 8B is a front view, FIG. 8C is a side view, and FIG. 9 is an exploded perspective view. The seventh embodiment is composed of a heat sink main body 20, cover 21 and cooling fan 22. The heat sink main body 20 is composed in such a manner that a large number of radiating fins 20b are perpendicularly arranged on the base 20a. The heat sink main body 20 is made of metal, the heat conductivity of which is high, such as aluminum or aluminum alloy by means of extrusion or cold forging. Alternatively, the heat sink main body 20 is made of resin, the heat conductivity of which is high.

At the center of the cover 21, there is provided a cooling fan 22. There is provided a ceiling plate 21a which is inclined in a transverse direction to the cooling fan 22. This ceiling plate 21a is made of resin or a metal sheet and covers the heat sink main body 20. At the four corners of the ceiling plate 21a, there are provided resilient engaging members 21b. The ceiling plate 21a is detachably mounted on the base 20a by the claws 21c (shown in FIG. 8B) attached to the ends of the engaging members 21b. The cooling fan 22 is fixed to the cover 21 by means of screws. In this structure, distances are determined as follows. Distance A from the bottom surface of the cover at the end portion of the heat sink main body to the upper surface of the heat sink main body is smaller than distance B from the bottom surface of the cover immediately below the fan to the upper surface of the heat sink main body 20. In this connection, when the length of the heat sink main body is approximately 100 mm, in order to maintain a good balance, it is preferable that the distances satisfy the equation B:A=5:3.

In the seventh embodiment composed as described above, the bottom surface of the base 20 of the heat sink main body 20 comes into close contact with the heating element. In general, the cooling fan has a characteristic such that the intensity of noise increases when the distance from the suction surface of the fan to an obstacle is small. In order to decrease the intensity of noise, it is necessary to provide a predetermined space (air gap). On the other hand, the cooling characteristic of the cooling fan is deteriorated at a position distant from the cooling fan because the air speed is lowered at the position where the radiating fans are located. Due to the foregoing, in the seventh embodiment, the distance from the cooling fan to the heat sink is increased immediately below the fan, and the distance from the cooling fan to the heat sink is decreased at the edge. Therefore, the deterioration of the cooling characteristic can be minimized without increasing the intensity of the noise.

FIGS. 10A, 10B, and 10C are views showing the eighth embodiment of the present invention. FIG. 10A is a plan view, FIG. 10B is a front view, and FIG. 10C is a side view. The structure of this eighth embodiment is substantially the same as that of the seventh embodiment described above. One different point is a method of connecting the heat sink main body 20 with the cover 21. The connecting method of this embodiment is described as follows. One end of the cover 21 is connected with the heat sink main body 20 by a hinge pin 23, and the other end is fixed by a spring made of a wire.

In this embodiment composed as described above, it is not necessary to remove the cover 21 and the cooling fan 22 when work is conducted on the heating element. That is, when the heat sink of this embodiment is fixed to the heating element, the spring 24 to lock the cover 21 is disconnected so as to open and close the cover 21. Due to the foregoing, a hole in which the heat sink main body is fixed can be exposed, and screws are inserted and fixed into the hole. Other effects of the eighth embodiment are the same as those of the seventh embodiment.

Figure 11A:
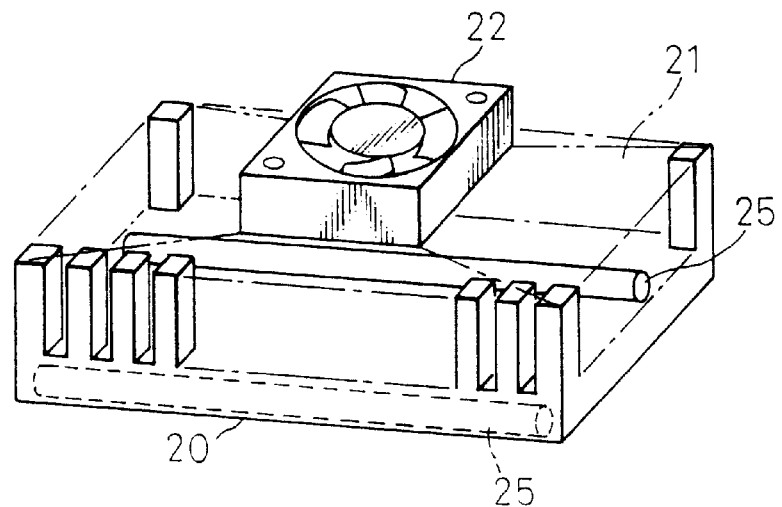
Figure 11B:
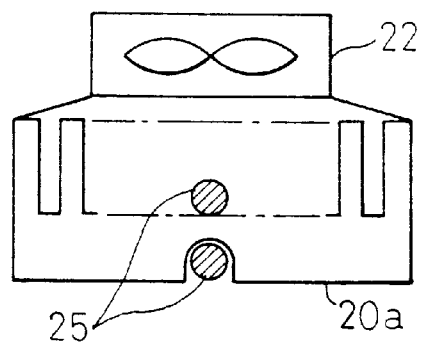
Figure 11C:
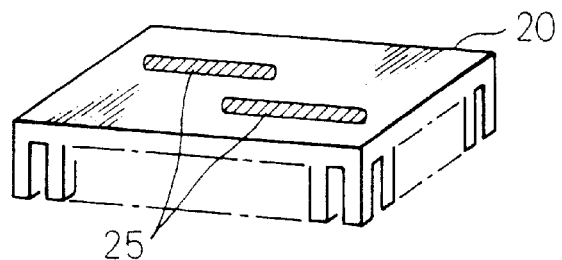

FIGS. 11A, 11B, and 11C are views showing the ninth embodiment of the present invention. FIG. 11A is a perspective view, FIG. 11B is a cross-sectional view, and FIG. 11C is a rear view. The structure of the ninth embodiment is composed of a rectangular heat sink main body 20 of which the bottom surface comes into contact with the heating element, a cover 21 and a cooling fan 22. The heat sink main body 20 and the cover 21 are made of the same material as that of the aforementioned embodiment. As shown in FIGS. 11A and 11B, there is provided a heat conveyance member 25 composed of a heat pipe made of metal of good heat conductivity on the upper surface, bottom surface or side of the base 20a of the heat sink main body 20. As shown in FIG. 11C, the heat conveyance member 25 may be divided into two pieces.

In the embodiment composed as described above, the heat conveyance member 25 is arranged in the high temperature section at the center toward the end portion in the longitudinal direction. Therefore, it is possible to prevent a decrease in the quantity of heat transmitted in the longitudinal direction of the heat sink main body 20, that is, it is possible to prevent a decrease in the radiating efficiency at the end of the heat sink main body. Due to the foregoing structure, the temperature of the end portion is not lowered, so that the overall heat sink can be uniformly heated and the cooling performance can be enhanced.

Figure 12A:
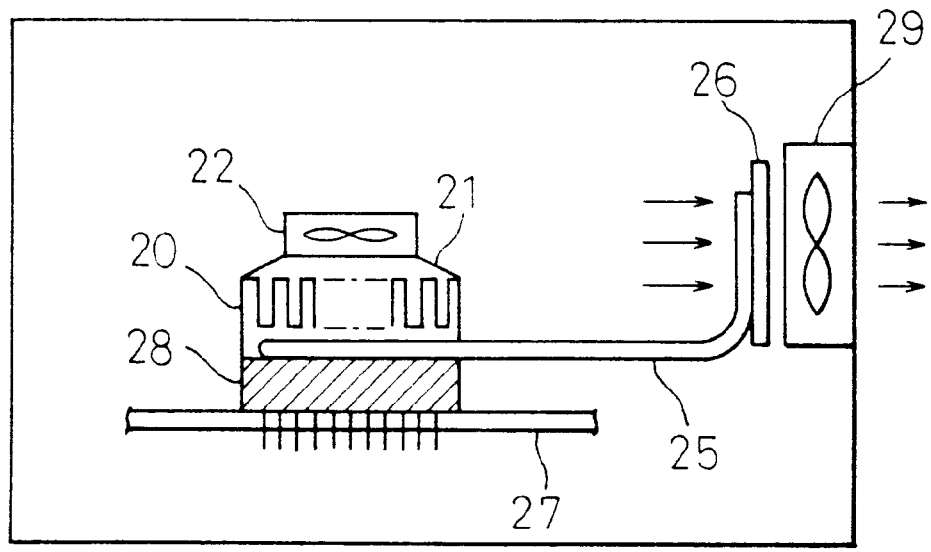
Figure 12B:
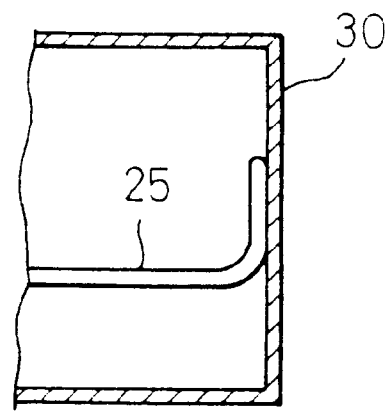

FIGS. 12A and 12B are views showing the tenth embodiment of the present invention. FIG. 12A is a cross-sectional view, and FIG. 12B is a rear view showing a variation of the tenth embodiment. The structure of this embodiment is composed of a rectangular heat sink main body 20 of which the bottom surface comes into contact with the heating element, a cover 21, a cooling fan 22 and a heat conveyance member 25. The heat sink main body 20 and the cover 21 are made of the same material as that of the aforementioned embodiment. In this embodiment, the heat conveyance member 25 is attached to another cooling section 26. Alternatively, the heat conveyance member 25 is directly attached to the casing 30 as shown in FIG. 12B. In this connection, in the view, reference numeral 27 is a mother board, reference numeral 28 is a heating element, and reference numeral 29 is a system fan.

In this embodiment composed as described above, the heat conveyance member 25 is arranged in the heat sink, so that heat can be conveyed to another cooling section. Accordingly, this embodiment can solve the conventional problems in which the heat sink capacity can not be increased and the fan capacity can not be increased when the processing speed is raised and the quantity of generated heat is increased, because the space to accommodate the heat sink having a fan is limited in the conventional structure. According to this embodiment, the problems caused when a quantity of generated heat is increased can be solved by providing a mounting space in which the present heat sink having a fan is mounted. Accordingly, this embodiment can contribute to an enhancement of the apparatus.

Figure 13A:
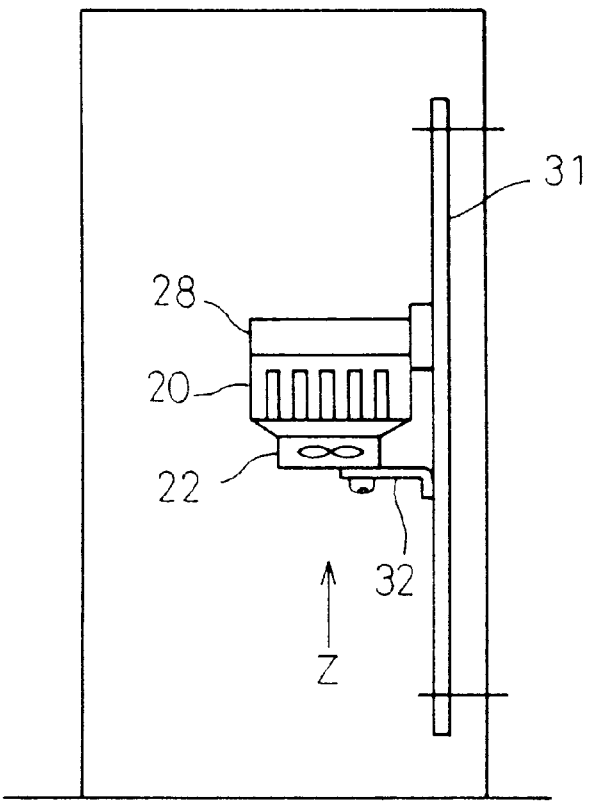
Figure 13B:
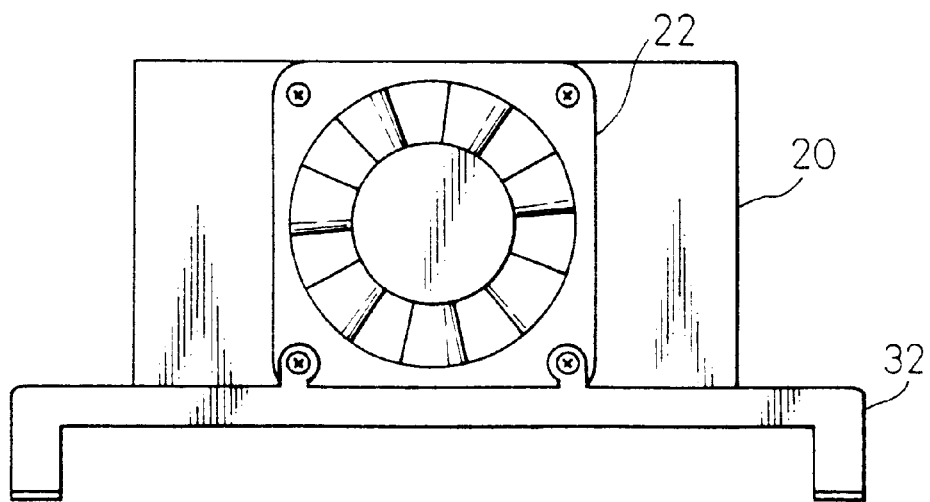

FIGS. 13A and 13B are views showing the eleventh embodiment of the present invention. FIG. 13A is a cross-sectional view, FIG. 13B is a view taken in the direction of arrow Z in FIG. 13A. The structure of this embodiment is composed of a heat sink main body 20 of which the bottom surface comes into contact with the heating element 27, a cooling fan 22, a heating element 28, and a printed circuit board 31. The heat sink is fixed onto the printed circuit board 31 by a bracket 32 for fixing the heat sink, wherein the bracket 32 uses a hole for fixing the cooling fan 22.

Figure 14C:
Figure 14A:
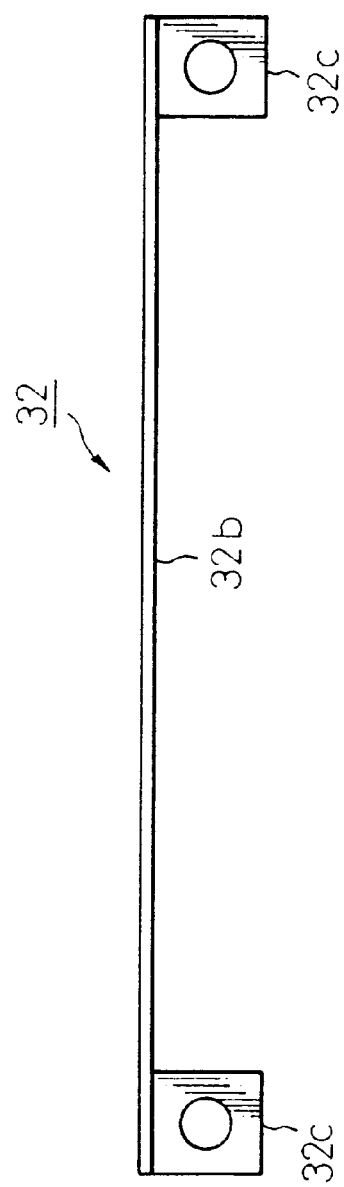
Figure 14B:
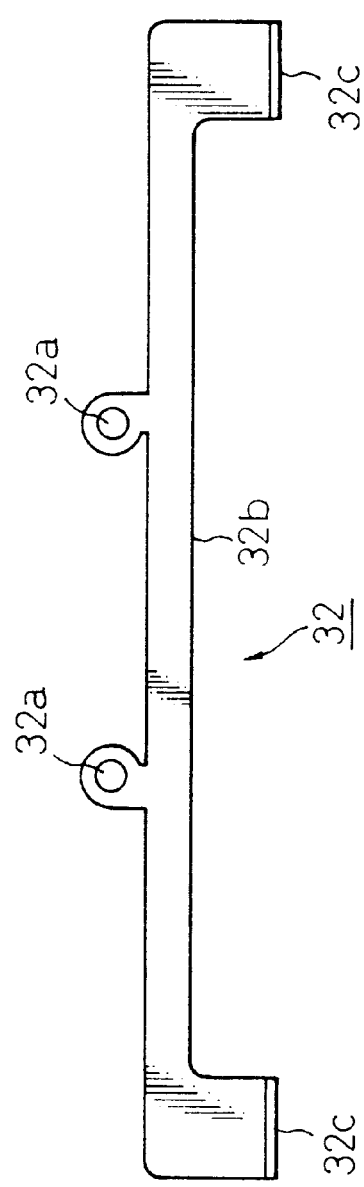
Figure 15A:
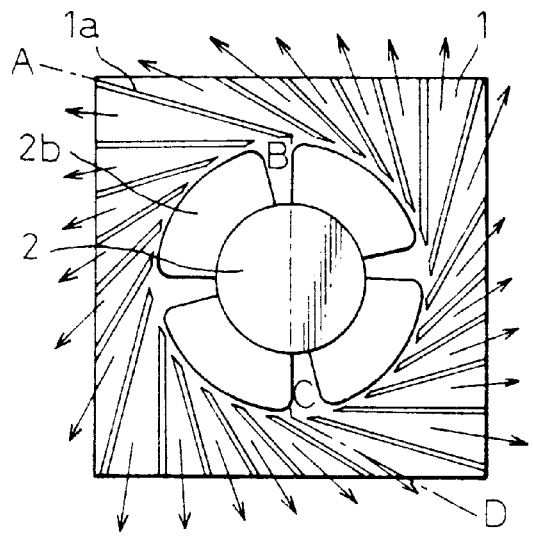
Figure 15B:
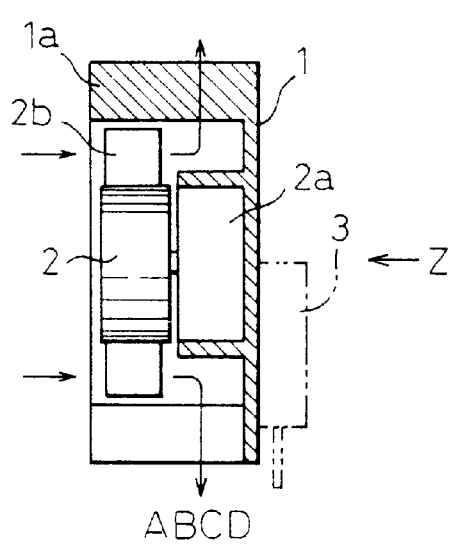
Figure 15C:
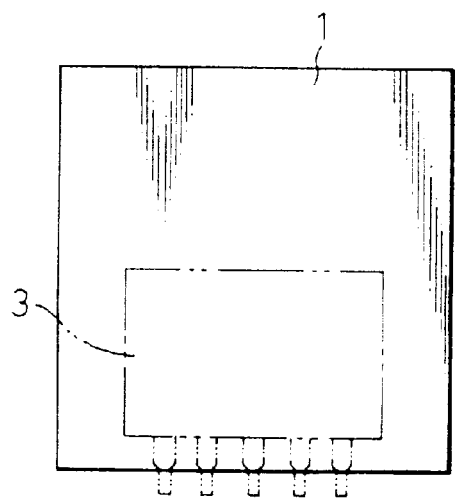
Figure 16:
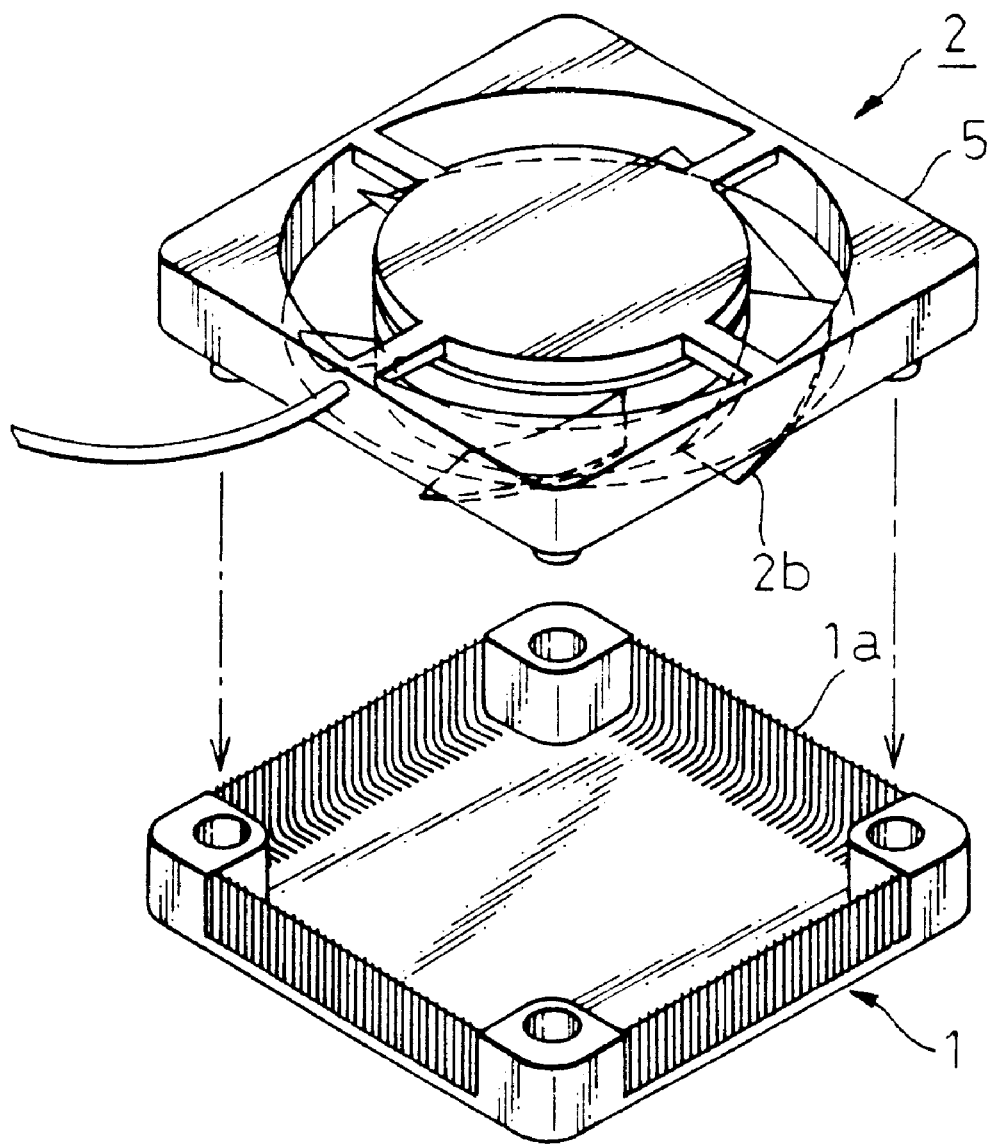
FIG. 16 is an exploded perspective view showing another example of the conventional heat sink.
Figure 17A:
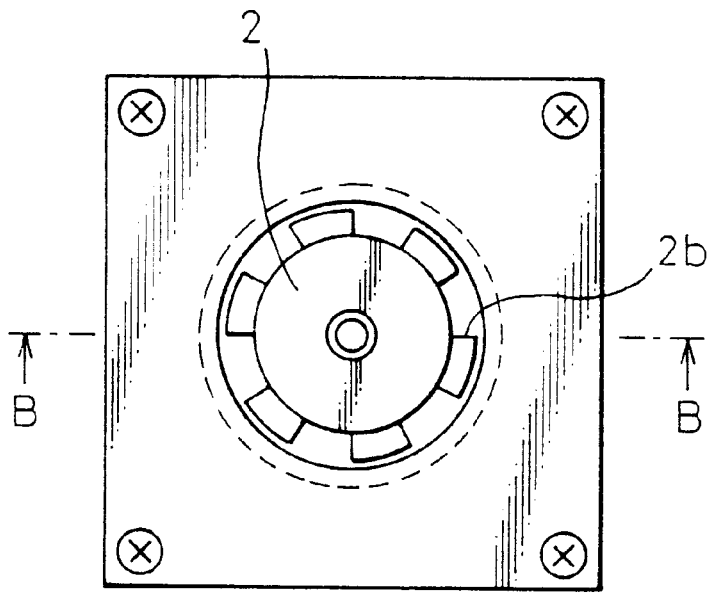
Figure 17B:
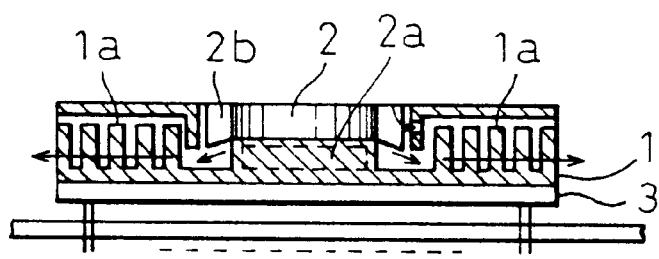

In this connection, as shown in FIGS. 14A, 14B, and 14C, the bracket 32 for fixing is composed in such a manner that legs 32c are formed at both end portions of the bar 32b having two holes 32a for fixing the cooling fan 22. The reason why the interval of these two legs 32c is longer than the length of the heat sink main body 20 is to prevent wire gathering to an MPU which is a heat generating element. When this embodiment is applied to a case in which the center of gravity of the heating element is high and the heating element is susceptible to damage by vibration and shock, it is possible to take a countermeasure against vibration and shock at a low cost.

According to the heat sink of the present invention, the main body of the heat sink is formed into a box-shape having an upper surface, and the cooling fan is embedded in the box. Therefore, it is possible to manufacture a heat sink, at a low cost, the cooling capacity of which is high and the designing of which can be easily performed. Since the cooling fan is fixed onto the upper surface, it is possible to prevent the temperature of the bearing of the cooling fan from becoming high, so that deterioration of lubricant is prevented and the reliability can be enhanced. When the heat conveyance member is incorporated into the main body of the heat sink, the cooling efficiency can be enhanced, which contributes to an enhancement of the performance of the apparatus.

It is to be understood that the invention is by no means limited to the specific embodiments illustrated and described herein, and that various modifications thereto may be made which come within the scope of the present invention as defined in the appended claims.

I claim:

1. A heat sink comprising:

a heat sink component having a rectangular base with a bottom surface coming into contact with a heating element;

a cooling fan having blades and a motor;

a cover for fixing the fan to the heat sink component; and a heat conveyance member for diffusing heat disposed on the bottom surface of the base of the heat sink component.

2. An information processor comprising:

a heat sink component having a base with a bottom surface coming into contact with a heating element;

a cooling fan having blades and a motor; and a cover for fixing the fan to the heat sink component; and a heat conveyance member attached to the base of the heat sink component so as to convey heat to another cooling section.

3. A heat sink according to claim 1, wherein said rectangular base has a longer side and a shorter side, said heat conveyance member extending generally parallel to the longer side.

4. A heat sink according to claim 1, wherein said heat conveyance member comprises a heat pipe.

5. A heat sink according to claim 2, wherein said heat conveyance member comprises a heat pipe.

* * * * *